United States Patent
Sezi et al.

(10) Patent No.: US 7,108,807 B2
(45) Date of Patent: Sep. 19, 2006

(54) METHODS FOR PRODUCING A DIELECTRIC, DIELECTRIC HAVING SELF-GENERATING PORES, MONOMER FOR POROUS DIELECTRICS, PROCESS FOR PREPARING POLY-O-HYDROXYAMIDES, PROCESS FOR PREPARING POLYBENZOXAZOLES, AND PROCESSES FOR PRODUCING AN ELECTRONIC COMPONENT

(75) Inventors: Recai Sezi, Rottenbach (DE); Andreas Walter, Egloffstein (DE); Klaus Lowack, Erlangen (DE); Anna Maltenberger, Leutenbach (DE); Robert Banfic, Nürnberg (DE)

(73) Assignee: Infineon Technologies AG, Munich (DE)

( * ) Notice: Subject to any disclaimer, the term of this patent is extended or adjusted under 35 U.S.C. 154(b) by 240 days.

(21) Appl. No.: 10/424,376

(22) Filed: Apr. 28, 2003

(65) Prior Publication Data

US 2004/0028821 A1 Feb. 12, 2004

(30) Foreign Application Priority Data

Apr. 26, 2002 (DE) ................ 102 18 788

(51) Int. Cl.
*H01B 3/30* (2006.01)
*C08G 73/22* (2006.01)

(52) U.S. Cl. .............. 252/576; 252/575; 525/420; 525/422; 525/540; 528/97; 528/98; 528/99; 528/176; 528/183; 528/272; 528/288; 528/289; 528/291; 528/363

(58) Field of Classification Search ........... 525/422, 525/420, 540; 252/575, 576; 528/97, 98, 528/99, 176, 183, 272, 288, 289, 291, 363
See application file for complete search history.

(56) References Cited

U.S. PATENT DOCUMENTS

| 4,525,539 | A | 6/1985 | Feiring |
| 5,077,378 | A | 12/1991 | Mueller et al. |
| 5,776,990 | A | 7/1998 | Hedrick et al. |
| 6,531,632 | B1 | 3/2003 | Haussmann et al. |
| 2003/0060573 | A1* | 3/2003 | Walter et al. ........... 525/452 |

FOREIGN PATENT DOCUMENTS

DE 100 11 608 A1 10/2001
EP 0 317 942 A2 5/1989

OTHER PUBLICATIONS

Gaik, U. et al.: "Synthesis of New Polymers Containing Naphth[4,5-a]oxazole Moieties in the Chain", Makromol. Chem., Rapid Commun., 1981, pp. 355-358.
Bansal, S. R. et al.: "Reactions of Copper (II) Halides with Aromatic Compounds-IX", Tetrahedron, Pergamon Press, Great Britain, vol. 29, 1973, pp. 993-999.
Akimoto, H. et al.: "Stereochemical Studies VIII", Tetrahedron, Pergamon Press, Great Britain, vol. 27, 1971, pp. 5999-6009.
Akimoto, H. et al.: "Determination of the Absolute Configuration of 1,1'-Binaphythly and its Derivatives by X-Ray Diffraction", Tetrahedron Letters, Pergamon Press, Great Britain, No. 1, 1968, 97-102.
Cassebaum, H.: "Die Konstitution des β-Dinaphthyl-Dichinhydrons"[The Constitution of β-Dinaphthyl-Dichinhydron], Institute für Organische Chemie der Universität Halle, Apr. 12, 1957, pp. 1537-1547.
Chemistry Abstract 109: 129869 (Jedlinski, Z. et al.), dated 1988.
Chemistry Abstract 95: 204466 (Jedlibski, Z. et al.), dated 1981.
Chemistry Abstract 92: 180854 (Jedlinski, Z. et al.), dated 1980.

* cited by examiner

*Primary Examiner*—Jeffrey B. Robertson
(74) *Attorney, Agent, or Firm*—Laurence A. Greenberg; Werner H. Stemer; Ralph E. Locher

(57) ABSTRACT

Poly-o-hydroxyamides include binaphthyl substituents as repeating units. The poly-o-hydroxyamides can be cyclized to give the polybenzoxazole by heating. Pore formation occurs, so that a dielectric having a very low dielectric constant k of less than 2.5 is obtained.

2 Claims, 1 Drawing Sheet

METHODS FOR PRODUCING A DIELECTRIC, DIELECTRIC HAVING SELF-GENERATING PORES, MONOMER FOR POROUS DIELECTRICS, PROCESS FOR PREPARING POLY-O-HYDROXYAMIDES, PROCESS FOR PREPARING POLYBENZOXAZOLES, AND PROCESSES FOR PRODUCING AN ELECTRONIC COMPONENT

BACKGROUND OF THE INVENTION

Field of the Invention

The invention relates to poly-o-hydroxyamides, a process for their preparation, polybenzoxazoles, and a process for their preparation, monomers for the preparation of the poly-o-hydroxyamides, an electronic component that contains the polybenzoxazoles as a dielectric, and a process for the production of such electronic components.

In order to avoid cross-talk of signals which is caused by capacitive coupling, adjacent conductor tracks in microchips are insulated from one another by a dielectric disposed between the conductor tracks. Compounds that are to be used as a dielectric must meet various requirements. Thus, the signal transit time in microchips depends both on the material of the conductor track and on the dielectric that is disposed between the conductor tracks. The lower the dielectric constant of the dielectric, the shorter too is the signal transit time. The dielectrics used to date are based on silica and have a dielectric constant of about four (4). These materials are gradually being replaced by organic dielectrics that have a substantially lower dielectric constant. The dielectric constant of these materials is generally below three (3).

In the microchips customary at present, the conductor tracks preferably are formed from aluminum, AlCu, or AlCuSi. With increasing integration density of the memory chips, there is a changeover to copper as conductor track material, owing to its lower electrical resistance in comparison with aluminum. Copper permits shorter signal transit time and hence a reduction in the conductor track cross section. In contrast to the techniques customary to date, in which the dielectric is introduced into the trenches between the conductor tracks, in the copper damascene technique, the dielectric is first structured. The resulting trenches are first coated with a very thin barrier that is composed, for example, of titanium, titanium nitride, tantalum, tantalum nitride, silicon carbide, silicon nitride, or silicon carbonitride. The trenches are then first filled with copper and then excess copper is ground off mechanically. The dielectric must therefore be stable to the materials used for the grinding and must have sufficient adhesion to the substrate in order to avoid becoming detached during the mechanical grinding process. Furthermore, the dielectrics must also have sufficient stability in the following process steps in which further components of the microchips are produced. For this purpose, they must, for example, have sufficient thermal stability and must not undergo decomposition even at temperatures of more than 400° C. Moreover, the dielectric must be stable to process chemicals, such as solvents, strippers, bases, acids or aggressive gases. Further requirements are good solubility and a sufficient shelf-life of the intermediates from which the dielectrics are produced.

With unfluorinated polymers that have sufficient thermal stability, dielectric constants down to about 2.5 are obtainable. By fluorination of the polymers, it is true that the dielectric constant can be further reduced. However, these materials have poor adhesion to the substrate and, at high temperatures, eliminate fluorine-containing decomposition products, which may damage the chip.

In order to be able to provide materials having a dielectric constant of <2.5, porous materials are currently being investigated in more detail. Owing to the air-filled nanopores, the dielectric constant decreases to values of two (2) or less. However, the porosity of the materials must not be chosen too high because their mechanical stability otherwise greatly decreases and the dielectric does not withstand mechanical loads as occur in chemical mechanical planarization (CMP). Furthermore, the processing of the currently available porous dielectric is very difficult because both the process conditions and the solvent used have a great influence on pore size and pore size distribution. In most cases, the production of pores is effected by thermal decomposition reactions that have to be very exactly controlled. The decomposition products enter the air or ovens and, in addition to soiling and damaging the apparatuses, can also constitute a health hazard.

U.S. Pat. No. 5,776,990 to Hedrick, et al. describes a porous polymer having a mean pore size of less than 100 nm. The copolymer is formed from thermally stable and thermally labile blocks. If a film of such a polymer is heated above the decomposition temperature of the labile block, a porous dielectric forms. In order to obtain the desired pore size, however, exact control of the process conditions is required, such as the sequence of temperature steps or the solvent used. Furthermore, gaseous byproducts that can soil or damage the apparatuses used and that are hazardous to health form.

Polybenzoxazoles (PBO) are polymers that have very high heat stability. The substances are already used for the production of protective and insulating layers. Polybenzoxazoles can be prepared by cyclization of poly-o-hydroxyamides. The poly-o-hydroxyamides have good solubility in organic solvents and good film formation properties. They can easily be applied to electronic components by using the spin coating technique. After a thermal treatment in which the poly-o-hydroxyamide is cyclicized to give the polybenzoxazole, a polymer that has the desired properties is obtained. Polybenzoxazoles can also be processed directly in their cyclized form. In this case, however, there are as a rule difficulties with the solubility of the polymer. Building blocks of poly-o-hydroxyamides are described, for example, in commonly-owned German Patent Application DE 100 11 608, which corresponds to U.S. Pat. No. 6,531,632 B2.

The mechanism taking place in the cyclization of poly-o-hydroxyamides to polybenzoxazoles is shown schematically below:

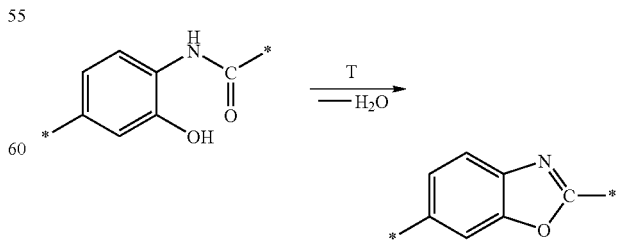

Upon heating, the o-hydroxyamide undergoes cyclization to give the oxazole; water is liberated.

SUMMARY OF THE INVENTION

It is accordingly an object of the invention to provide methods for producing a dielectric, a dielectric having self-generating pores, a monomer for porous dielectrics, a process for preparing poly-o-hydroxyamides, a process for preparing polybenzoxazoles, a processes for producing an electronic component, and a method for forming a dielectric that overcome the hereinafore-mentioned disadvantages of the heretofore-known devices of this general type and that provide and involve polymers that can be easily applied to electronic components and that have a good electrical insulating effect after their cyclization and exhibit sufficient thermal stability and very good adhesive and filling properties.

With the foregoing and other objects in view, there is provided, in accordance with the invention, a poly-o-hydroxyamide having a Formula I:

FORMULA I

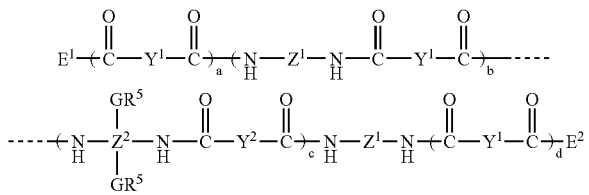

in which $E^1$ and $E^2$, in each case independently, are hydrogen, a hydroxyl group or a saturated or unsaturated monovalent hydrocarbon substituents that may also contain one or more hetero atoms;

$Y^1$ and $Y^2$, in each case independently for each position, are a divalent hydrocarbon substituent which may also contain one or more hetero atoms; $Z^1$, in each case independently for each position, is a structural unit of the Formula IIa or IIb FORMULA IIa

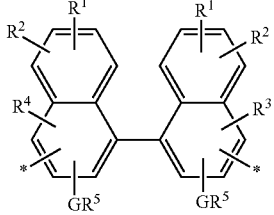

in which the bond (—*) and the substituent -$GR^5$ are configured in the ortho position relative to one another, FORMULA IIb

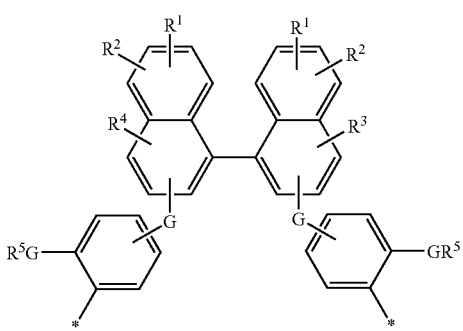

$Z^2$, in each case independently for each position, is a tetravalent hydrocarbon substituent which is composed of alkyl and/or aryl substituents linked to one another and may also include one or more hetero atoms;

$R^1$, $R^2$, $R^3$, and $R^4$, in each case independently, are H, —$C_6H_5$, —$(CH_2)_n$—$CH_3$, -G-$(CH_2)_n$—$CH_3$, —CH$((CH_2)_nCH_3)_2$, —CH$(CH_3)_2$, -G-CH$(CH_3)_2$, —C$(CH_3)_3$, -G-C$(CH_3)_3$, —$(CF_2)_n$—$CF_3$, -G-$(CF_2)_n$—$CF_3$, —CF$((CF_2)_nCF_3)_2$, —CF$(CF_3)_2$, —C$(CF_3)_3$, —N$(CH_3)_2$, —N$(CF_3)_2$, $R^5$, in each case independently, is H, —CO$(CH_2)_n$—$CH_3$, —COO—$(CH_2)_n$—$CH_3$, —$(CH_2)_n$—$CH_3$, —CH$((CH_2)_nCH_3)_2$, —CH$(CH_3)_2$, —C$(CH_3)_3$, —$(CF_2)_n$—$CF_3$, —CF$((CF_2)_nCF_3)_2$, —CF$(CF_3)_2$, —C$(CF_3)_3$, —$(CH_2)_n$—$C_6H_5$, —COO—$(CH_2)_n$—$C_6H_5$, G is oxygen or sulfur, a is 0 or 1, b has a value of from 1 to 200, c has a value of from 0 to 200, d is 0 or 1, and n is an integer from 0 to 10.

For reasons of simplicity, both the poly-o-hydroxyamides (G=O) and the poly-o-thioamides (G=S) of the Formula I are referred to below as poly-o-hydroxyamides. Statements made in connection with the polymer groups described above apply in context to both classes of compounds. Formula I represents a polymer having a continuous polymer backbone. For reasons of simplicity, however, the molecule in Formula I was represented in two parts.

The poly-o-hydroxyamides of the Formula I, according to the invention, form, on cyclization to give the polybenzoxazole, pores having a magnitude of a few ten nanometers without it being necessary to provide a component, for example a thermally labile block or an additive, in the polymer material. The pore size is influenced primarily by the structure of the poly-o-hydroxyamide of the Formula I and only to a small extent by the process conditions, i.e. the solvent used and the temperature program. It is not necessary to provide additional components that are decomposed to give gaseous products, in order to produce pores. Consequently, during pore formation, no impurities form and no damage is done to the microchip structures already produced. After the cyclization, the polybenzoxazoles obtained have dielectric constants of less than 2.5, owing to the porosity of the material, which corresponds to the lower limit of the fluorine-free polybenzoxazoles having high thermal stability. The adhesion of the polybenzoxazole prepared from the poly-o-hydroxyamide of the Formula I to surfaces relevant for chip technology, such as silicon, silicon carbide, silicon carbonitride, silicon nitride, silica, titanium, tantalum, titanium nitride, tantalum nitride or silicon oxynitride, is very good. Furthermore, the polybenzoxazoles have high stability to chemicals as used in the production of microchips, such as solvents, strippers, bases, acids, or aggressive gases. The polymer materials are therefore very suitable for microelectronic applications. Moreover, the materials are also outstandingly suitable for the copper damascene technique. During the copper grinding process, no disadvantageous effects occur, such as delamination, cracking or blister formation. The poly-o-hydroxyamides of the Formula I, according to the invention, are very readily soluble in many organic solvents. Solvents that may be used are, for example, acetone, cyclohexanone, diethylene glycol monoethyl or diethyl ether, N-methylpyrrolidone, γ-butyrolactone, ethyl lactate, methoxypropyl acetate, tetrahydrofuran, ethyl acetate and mixtures of said solvents. The solutions can be very readily applied to surfaces of electronic components e.g. by spin coating, spraying or dip methods and have a very good film quality. Trenches having a width of less than 100 nm and an aspect ratio of >4 can also be filled without difficulties. The poly-o-hydroxyamides according to the invention can be cyclized by heating to temperatures of 200 to 500° C. Apart from the desired pore formation, there is no formation of defects, such as cracks in the filled trenches.

The poly-o-hydroxyamides of the Formula I are prepared from bis-o-aminophenols and dicarboxylic acids or their derivatives. The substituents derived from the dicarboxylic acids can have a wide variety of structures. They may include saturated, unsaturated or aromatic hydrocarbon substituents, combinations of these substituents also being possible. Saturated substituents may be straight-chain or branched. Furthermore, one or more carbon atoms may also be replaced by heteroatoms, or the substituents $Y^1$ and $Y^2$ may also have groups formed from a plurality of heteroatoms. Heteroatoms are understood here as meaning atoms which are not carbon or hydrogen. Particularly preferred heteroatoms are O, N, S, Si, and P. The chain length determined by the indices a, b, c, and d can be controlled by the reaction conditions, for example by using the rate of addition of the starting materials or by controlling the temperature at which the reaction is performed. Of course, a distribution of chain lengths is obtained in such a polymerization, the reaction being carried out in such a way that the average chain length is within the range of values indicated above for the indices a, b, c, and d. A narrow molecular weight distribution of the polymers is desirable. For the index b, the reaction is controlled in such a way that values in the range of 1 to 200, preferably 4 to 80, result. For the index c, the reaction is performed in such a way that values in the range of 0 to 200, preferably 0 to 50, result. The molecular weights or averaged chain lengths can be determined by customary methods, e.g. gel permeation chromatography (GPC).

The properties of the polymer are substantially determined by the group $Z^1$. In the group $Z^1$, the substituents $R^1$, $R^2$, $R^3$, and $R^4$ are particularly preferably hydrogen atoms and the substituents $GR^5$ are particularly preferably a hydroxyl group or acetyl group. These groups $Z^1$ permit cyclization to give the benzoxazole under comparatively mild conditions. Particularly preferred structures for the group $Z^1$ (formulae IIa and IIb) are shown below:

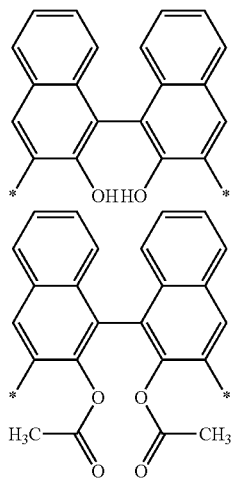

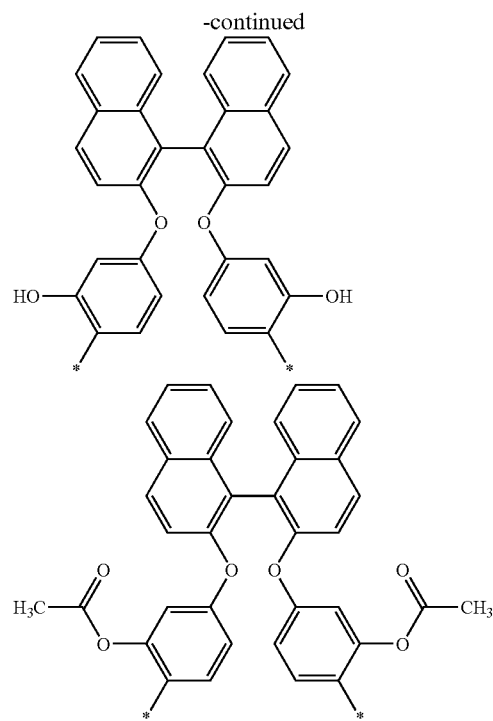

In addition to the groups $Z^1$, the polymer may also include further groups $Z^2$ which do not include any binaphthyl substituents. The groups $Z^2$ may have a very varied range of structures. The groups $Z^2$ preferably include 6 to 30 carbon atoms. The group $Z^2$ preferably includes one or two phenyl groups on which the group $GR^5$ and the nitrogen atom continuing the polymer chain are bonded. The group $GR^5$ and the nitrogen atom are preferably disposed in the ortho position relative to one another in order also to permit cyclization to give the oxazole in the case the groups $Z^2$. The part-structures of the group $Z^2$, in particular phenyl groups, which carry the groups $GR^5$ can be linked via alkylene and/or arylene groups or via groups formed from hetero atoms. The groups $Z^2$ can be substituted by monovalent groups, in particular alkyl groups. In particular, $Z^2$ is a structural unit which is selected from the group:

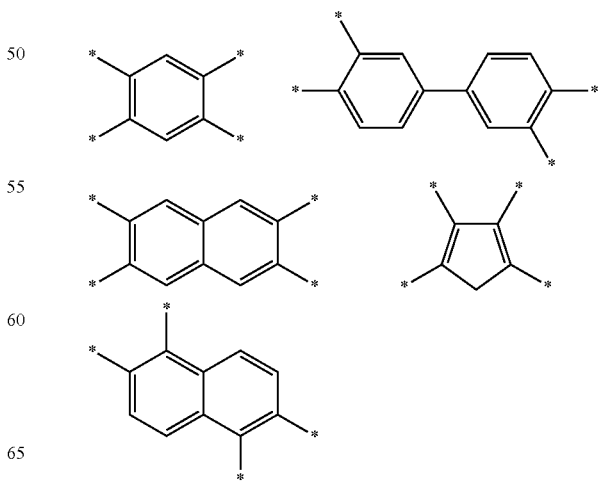

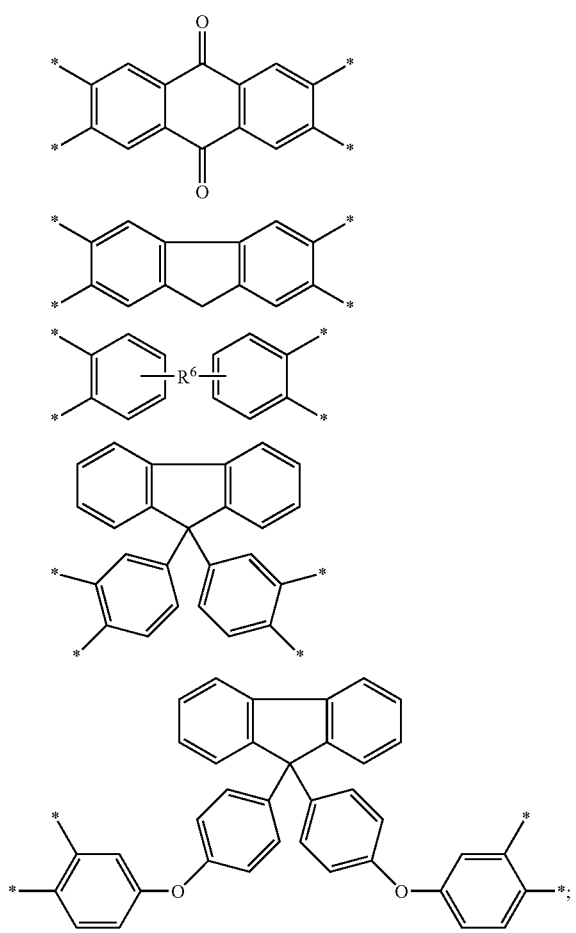

in which R⁶ is a divalent substituent that is selected from the following group:

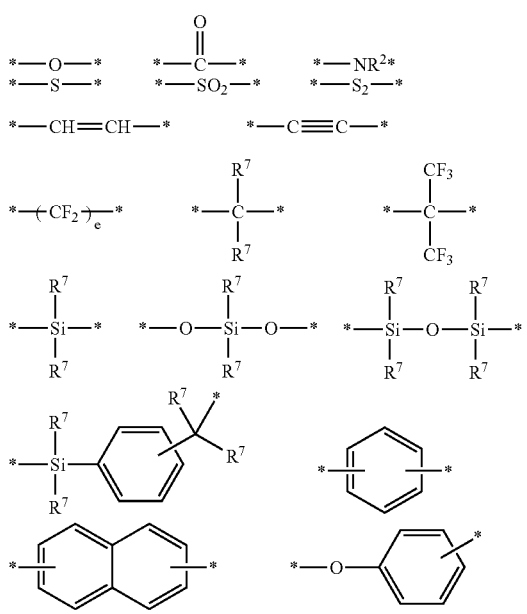

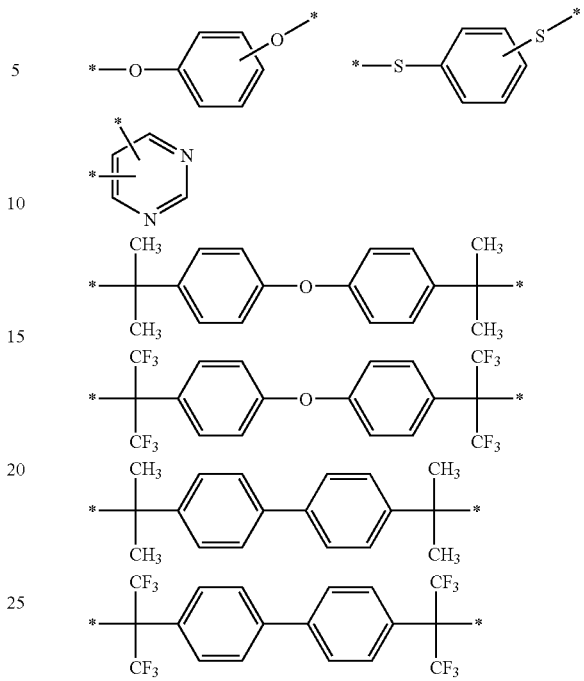

in which
R⁷ is an alkyl substituent having 1 to 10 carbon atoms or an aryl substituent having 5 to 22 carbon atoms; and
e is an integer from 1 to 10.

G in groups $Z^1$ and $Z^2$ is preferably an oxygen atom.

Among the abovementioned substituents $R^5$, the following substituents are particularly preferred:

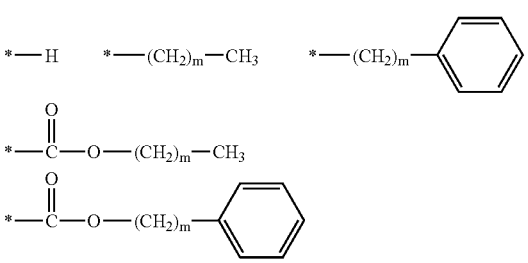

in which m is an integer from 0 to 10, in particular from 0 to 5.

The groups $Y^1$ and $Y^2$ may likewise have a very large variety of structures and preferably include 5 to 30 carbon atoms. The groups $Y^1$ and $Y^2$ may include saturated and unsaturated hydrocarbon groups as part-structures, aromatic hydrocarbon groups being preferred.

Examples of suitable divalent substituents of the groups $Y^1$ and $Y^2$ are shown below.

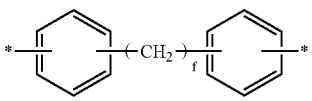

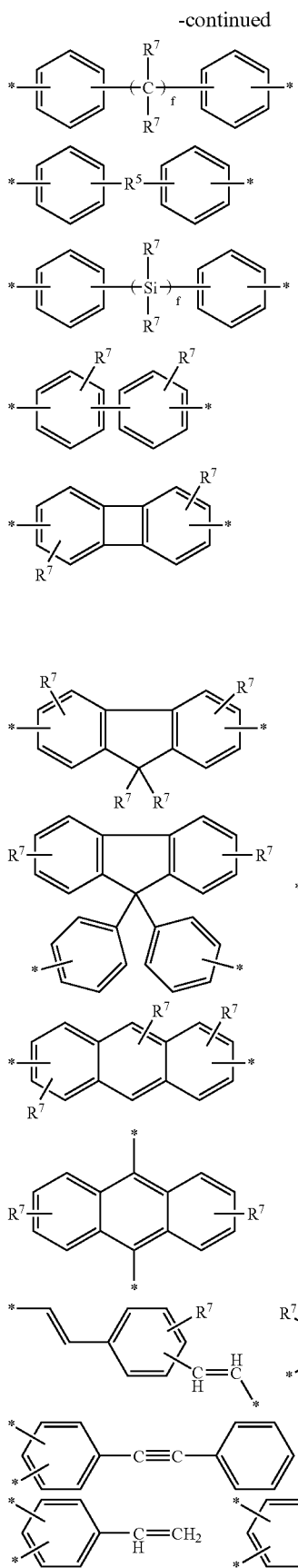
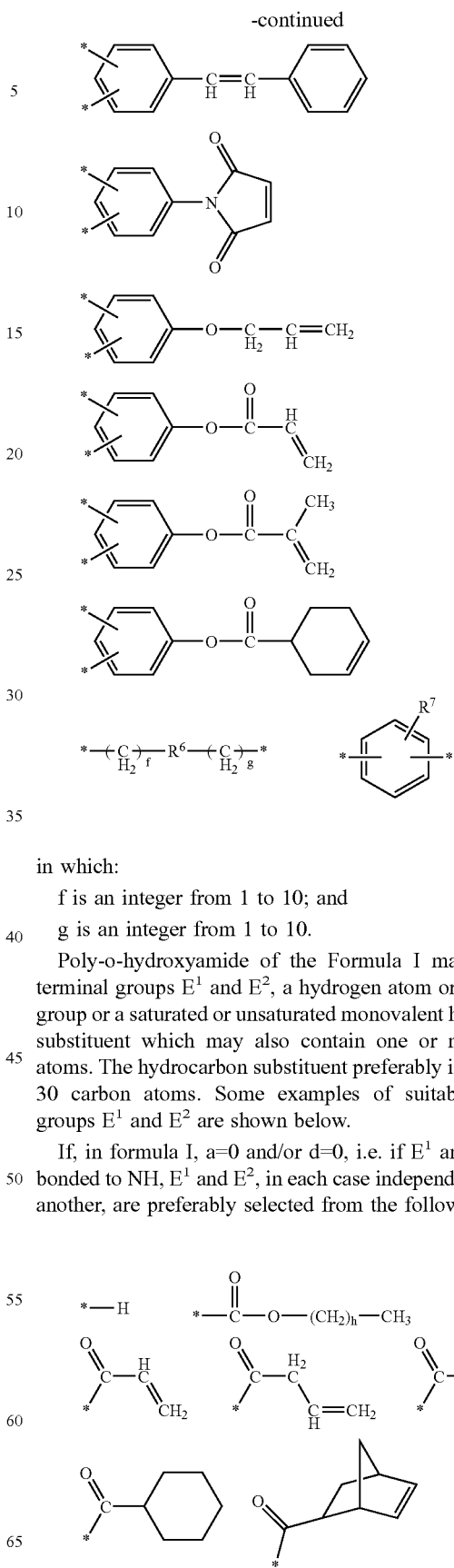

in which:
 f is an integer from 1 to 10; and
 g is an integer from 1 to 10.

Poly-o-hydroxyamide of the Formula I may carry, as terminal groups $E^1$ and $E^2$, a hydrogen atom or a hydroxyl group or a saturated or unsaturated monovalent hydrocarbon substituent which may also contain one or more hetero atoms. The hydrocarbon substituent preferably includes 1 to 30 carbon atoms. Some examples of suitable terminal groups $E^1$ and $E^2$ are shown below.

If, in formula I, a=0 and/or d=0, i.e. if $E^1$ and/or $E^2$ are bonded to NH, $E^1$ and $E^2$, in each case independently of one another, are preferably selected from the following group:

-continued

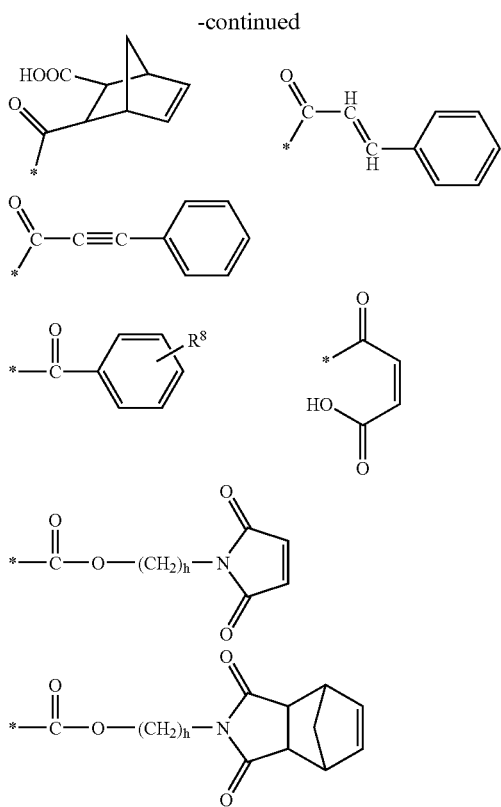

If, in Formula I, a=1 and/or d=1, i.e. the substituents $E^1$ and $E^2$ are bonded to CO, $E^1$ and $E^2$, in each case independently of one another, are preferably selected from the following group:

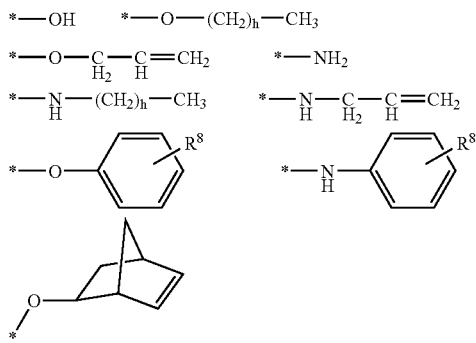

in which $R^8$ is selected from the following group:

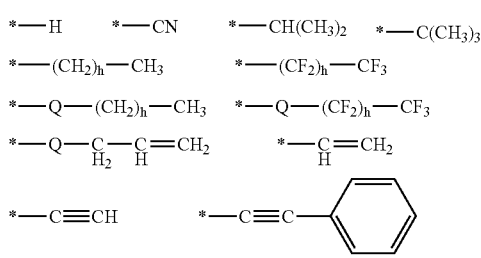

-continued

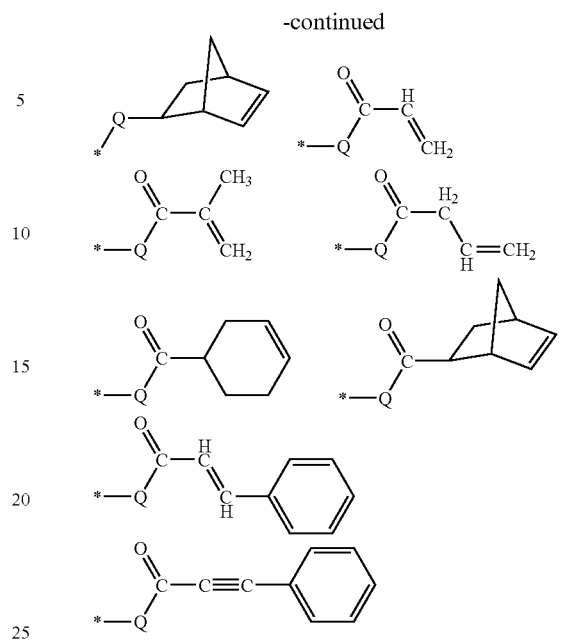

in which
h is 0–10, and
q is *—O—*, *—S—*, or *—NH—*.

The terminal groups $E^1$ and $E^2$ can be introduced into the poly-o-hydroxyamides of the Formula I by corresponding active precursors, for example acid chlorides.

The structures shown for the substituents $Y^1$, $Y^2$, $E^1$, and $E^2$ represent only a selection of preferred structures. However, this list should not be considered as being definitive.

As already mentioned, the polybenzoxazoles obtained from the poly-o-hydroxyamides of the Formula I by cyclization have advantageous properties with respect to the thermal stability, the mechanical strength and the electrical insulating effect. The invention therefore also relates to polybenzoxazoles of the Formula III

FORMULA III

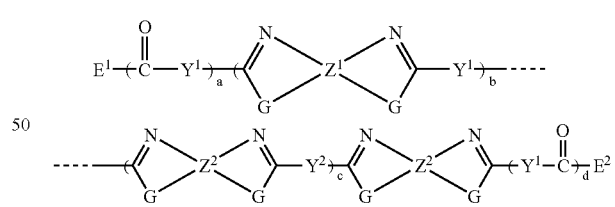

in which

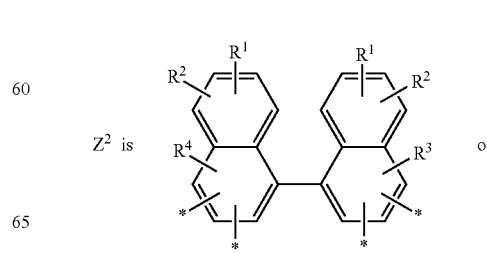

-continued

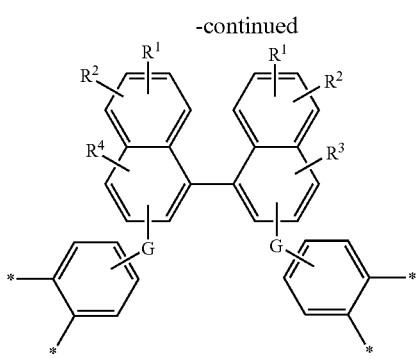

and a, b, c, d, $R^1$, $R^2$, $R^3$, $R^4$, $R^5$, $Y^1$, $Y^2$, $E^1$, $E^2$, and G have the meaning stated in the case of Formula I.

For reasons of simplicity, both polybenzoxazoles (G=O) and polybenzothiazoles (G=S) of the Formula III are referred to as polybenzoxazoles. The structures of the groups shown in the Formula III are equally applicable to both classes of compounds. Formula III represents a polymer having a continuous polymer backbone. For reasons of simplicity, however, the molecule in Formula III has been shown in two parts.

The poly-o-hydroxyamides of Formula I can be prepared by reacting bis-o-aminophenols or bis-o-aminothiophenols with dicarboxylic acids or their activated derivatives. The invention therefore also relates to monomers of the Formulae IVa and IVb:

FORMULA IVa

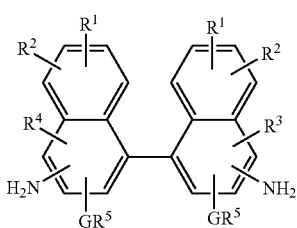

FORMULA IVb

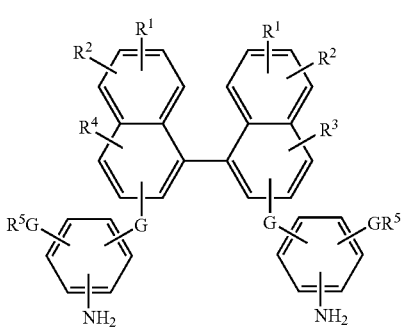

in which $R^1$, $R^2$, $R^3$, $R^4$, $R^5$, and G have the meanings stated in the case of Formula I.

The monomers of the Formulae IVa and IVb are prepared by customary synthesis processes, as described, for example, in Organikum, Wiley-VCH, 1999, page 228 et seq., page 324 et seq. and page 340 et seq. Similar monomers are described, for example, in U.S. Pat. No 4,525,539 or in European Patent No. EP 0 317 942.

The monomers of the Formulae IVa and IVb can be reacted with dicarboxylic acids or their activated derivatives to give the desired poly-o-hydroxyamides of the Formula I. The invention therefore also relates to a process for the preparation of poly-o-hydroxyamides of the Formula I, monomers of the Formula IVa and/or IVb being reacted with a dicarboxylic acid or an activated dicarboxylic acid derivative of the Formulae Va and/or Vb.

FORMULA Va

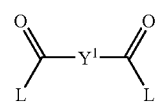

FORMULA Vb

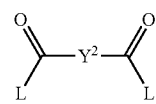

in which L is a hydroxyl group or an activating group and $Y^1$ and $Y^2$ have the meaning stated in the case of Formula I. For example, acid chlorides or activated esters, for example sulfonic acid esters, can be used as an activating group for the dicarboxylic acid derivatives of the formula V. The reaction of the monomers of the Formula IVa or IVb and of the dicarboxylic acids of the Formulae Va and Vb can, however, also be effected in the presence of a compound that activates the carboxylic acid, such as, for example, carbonyldiimidazole or dicyclohexylcarbodiimide. In principle, all reagents which bind the water formed in the reaction to themselves are suitable. For the preparation of the poly-o-hydroxyamides of the Formula I, the monomers of the Formula IVa or IVb and the dicarboxylic acid(s) or optionally the dicarboxylic acid derivatives of the Formula Va or Vb are reacted in an organic solvent at −20 to 150° C. in the course of 5 to 20 hours. If required, terminal groups of the polymer can be blocked with a suitable reagent in order thus to introduce the terminal groups $E^1$ and $E^2$. Suitable reagents have already been described in the explanation of the compounds of the Formula I. The poly-o-hydroxyamide of the formula I which has formed after the reaction is precipitated by dropwise addition of the reaction solution to a precipitating agent, washed and dried. Suitable precipitating agents are water and alcohols, such as isopropanol, butanol, or ethanol. Mixtures of these precipitating agents may also be used. It is also suitable for the precipitating agent to contain from 0.1% to 10% of ammonia. After filtration and drying, the precipitated polymer can be directly further processed and, for example for application to a semiconductor substrate, can be dissolved in one of the solvents mentioned further above.

The polymerization to give the poly-o-hydroxyamide of the Formula I can be carried out in the presence of a base in order to trap acid liberated. Suitable basic acid acceptors are, for example, pyridine, triethylamine, diazabicyclooctane, or polyvinylpyridine. However, other basic acid acceptors may also be used. Compounds that are readily soluble in the solvent used for the synthesis, for example N-methylpyrrolidone, and in the precipitating agent, for example water or water/alcohol mixtures, are those that are completely insoluble in the solvent, such as, for example, crosslinked polyvinylpyridine, are particularly preferred. The acid acceptors can then easily be separated from the resulting poly-o-hydroxyamide during the working up of the reaction product.

Particularly suitable solvents for the polymer synthesis are γ-butyrolactone, tetrahydrofuran, N-methylpyrrolidone, and dimethylacetamide. However, any solvent in which the starting components are readily soluble can in principle be used.

The invention furthermore relates to a process for the preparation of polybenzoxazoles of the Formula III, poly-o-hydroxyamides of the Formula I being heated. Heating results in the formation of an oxazole ring or thiazole ring with elimination of a small molecule, in general water, the polybenzoxazoles of the Formula III, according to the invention, being obtained. The pore formation that occurs is influenced only to a slight extent by the reaction conditions. The pores have a diameter in the region of a few ten nanometers and a narrow pore distribution. The process therefore permits large tolerances in the production of the dielectric, which substantially simplifies the reaction procedure.

The polybenzoxazole of Formula III, which is prepared by the process according to the invention, has a very low dielectric constant of $k \leq 2.5$, owing to the pores enclosed in the dielectric. It adheres very well to surfaces relevant to chip technology, such as silicon, silicon carbide, silicon carbonitride, silicon nitride, silica, titanium, tantalum, titanium nitride, tantalum nitride, or silicon oxynitride. The invention therefore also relates to an electronic component that contains the polybenzoxazole of Formula III described above. Polybenzoxazole of Formula III may be disposed, for example, as a dielectric between conductor tracks or conductor track planes or as a buffer layer between the microchip and the housing surrounding it. The dielectrics according to the invention are outstandingly suitable for the copper damascene technique. During the grinding process, no disadvantageous effects, such as delamination, cracking or blister formation, occur.

The invention therefore also relates to a process for the production of an electronic component, a solution of a poly-o-hydroxyamide of the Formula I in a solvent first being prepared. This solution is applied to a substrate and the solvent is evaporated so that a film is obtained. The film is then heated in order to cyclize the poly-o-hydroxyamide and convert it into the polybenzoxazole of Formula III. The film is then structured in order to obtain a resist structure which has trenches. A conductive material, for example copper, is then deposited on the resist structure so that the trenches are filled with a conductive material. Finally, excess conductive material is removed.

For example, lithographic processes can be used for structuring the polybenzoxazole film, an etch-resistant mask being produced on the film. The structure of the mask is then transferred into the film of the polybenzoxazole according to the invention by etching. Copper is preferably used as conductive material. A barrier can be provided between dielectric and conductive material. For example, the materials already mentioned further above are suitable as material for the barrier. Excess conductive material is removed, for example, by chemical mechanical planarization.

The invention furthermore relates to a process for the production of an electronic component, a solution of a poly-o-hydroxyamide of Formula I described above first being prepared in a solvent. The solution is then applied to a substrate that already has on its surface metallic structures between which trenches are formed. Such structures are, for example, conductor tracks. The solvent is evaporated so that the trenches are filled with the poly-o-hydroxyamide. Finally, the substrate is heated in order to cyclize the poly-o-hydroxyamide to give a polybenzoxazole.

The adhesion of the polyhydroxyamides to surfaces relevant in microelectronics, such as, for example, silicon, silica, silicon nitride, tantalum nitride, glass or quartz, can be improved by adding adhesion promoters.

For example, the following compounds can be used as adhesion promoters:

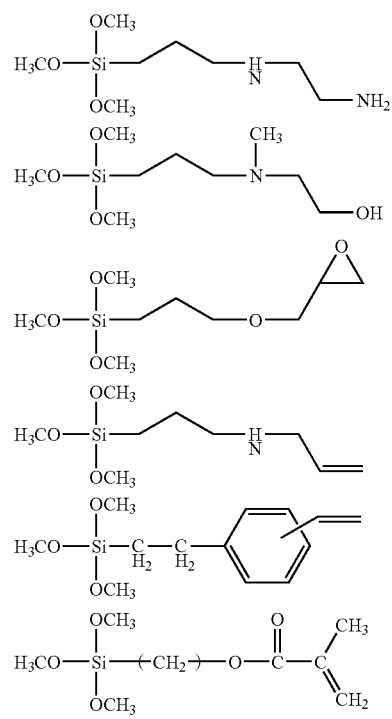

Other features that are considered as characteristic for the invention are set forth in the appended claims.

Although the invention is illustrated and described herein as embodied in methods for producing a dielectric, a dielectric having self-generating pores, a monomer for porous dielectrics, a process for preparing poly-o-hydroxyamides, a process for preparing polybenzoxazoles, a processes for producing an electronic component, and a method for forming a dielectric, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

EXAMPLE 1

Bis-o-aminophenols Having Oxygen Bridges

Figure 1:
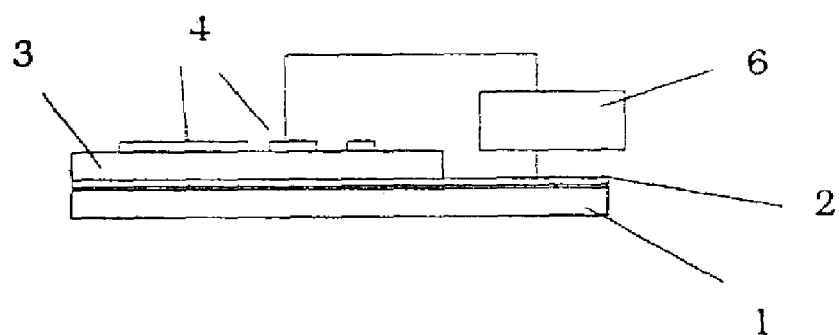
FIG. 1 is a partial diagrammatic and partial schematic drawing showing a setup according to the invention for determining an dielectric constant.

Stage 1:

The corresponding bishydroxybinaphthyl and 3-fluoro-6-nitrobenzyloxyphenol are initially introduced under inert gas (nitrogen or argon) into a three-necked flask that is provided with a stirrer and an inert gas connection, and N,N-dimethylformamide is added to these at room temperature. The mixture is stirred for about 10 to 20 minutes at room temperature. Thereafter, potassium carbonate is added in portions to the solution under inert gas. The solution is stirred at an elevated temperature for a few hours. The reaction temperature is suitably chosen from 60 to 140° C. The reaction occurs over course of 1 to 10 hours. In addition to N,N-dimethylformamide, for example, N-methylpyrrolidone, dimethyl sulfoxide, γ-butyrolactone, or dimethylacetamide can also be used. The concentrations of the starting materials are suitably chosen in a range from 5 to 50% by weight.

The suspension formed is cooled to room temperature and poured into a cooled (2–10° C.), aqueous potassium hydroxide solution. The product is precipitated in crystalline form. The precipitation can be accelerated by adding ethyl acetate. The product is filtered, washed with water, and then added to a 10% strength solution of acetic acid in water. The solution is stirred for 15 to 30 minutes, filtered, washed with water and dried under inert gas at 40° C./100 mbar in a drying oven until the weight remains constant. The crude product obtained in this manner is recrystallized from a solution in tetrahydrofuran and petroleum ether and dried again under reduced pressure.

Stage 2 (Hydrogenation and Simultaneous Elimination of the Benzyl Protective Group):

The hydrogenation is effected by known hydrogenation processes for nitro compounds, as described, for example, in European Patent No. EP 905 121, example 8. For this purpose, the nitro compound obtained in stage 1 can be dissolved, for example, in tetrahydrofuran, palladium on active carbon added and hydrogenation effected with hydrogen at superatmospheric pressure in an autoclave.

The bis((3-benzyloxy-4-nitro)phenoxy)binaphthyl prepared in stage 1 is dissolved in tetrahdyrofuran, and palladium on active carbon is added under inert gas. The amount of Pd/C is about 10% of the amount of the compound to be hydrogenated. The suspension is introduced into a previously heated hydrogenation reactor under argon inert gas and hydrogenated with hydrogen at room temperature under pressure. The hydrogenation time is in general 10 to 50 hours. The hydrogen pressure is suitably chosen from 0.5 to 5 bar. The concentration of the compound to be hydrogenated in tetrahydrofuran is 5 to 30% by weight. Instead of tetrahydrofuran, for example, dioxane, halogenated hydrocarbons or toluene can also be used as the solvent.

After the hydrogenation, the suspension is transferred under inert gas into pure ethanol, and concentrated hydrochloric acid is added with stirring until a clear solution forms. After the product has completely dissolved, the solution is filtered over a Büchner funnel in order to remove the Pd catalyst. Thereafter, about 70% of the amount of solvent is distilled off under reduced pressure and the concentrated solution is added to a solution of diethyl ether and acetone (volume ratio 7:3) with rapid stirring. During this procedure, the product is precipitated in crystalline form. The suspension is stored for 12–24 hours at 0° C. to 18° C. The product is then filtered off with suction and dried. The aminophenol is present as the hydrochloride. In contrast to the free aminophenol the form is not so greatly sensitive to oxidation by atmospheric oxygen.

EXAMPLE 2

Bis-o-aminophenols Without Oxygen Bridges

Stage 1:

Moistened silica is initially introduced into a three-necked flask provided with a stirrer, a reflux condenser and an inert gas connection, and 10% strength sulfuric acid is added. The ratios are chosen at about 10 parts by weight of silica per 6 parts by weight of 10% strength sulfuric acid. 200 parts by weight of dichloromethane and 10 parts by weight of dihydroxybinaphthyl are then added in this sequence. About 10 parts by weight of 65% strength nitric acid are then added at a temperature of 2 to 10° C. in the course of 15 to 60 minutes. After the end of the addition, the suspension is stirred until quantitative conversion of the starting material at room temperature. The abovementioned ratio can be changed in a range of up to about 20%. Instead of dichloromethane, other halogenated hydrocarbons may also be used as the solvent.

After complete conversion, the suspension is filtered. The product, which is present adsorbed onto the $SiO_2$ surface, is dissolved in a suitable solvent, such as, for example, acetone or ethyl acetate, and filtered. This procedure is repeated twice. The organic fractions are combined and evaporated down. The concentrated solution is slowly poured into dimethyl ether while stirring, and the precipitated product is filtered off with suction. The product is then dried under inert gas at 40° C./100 mbar in a drying oven until the weight remains constant.

Stage 2:

The hydrogenation of the compound obtained in stage 1 is carried out in the same manner as described in example 1.

EXAMPLE 3

Synthesis of 2,2'-diacetoxy-3,3'-diamino-1,1'-binaphthyl as the hydrochloride

Stage 1: 2,2'-Diacetoxy-3,3'-dinitro-1,1'-binaphthyl 4.088 g (14.29 mmol) of 2,2'-dihydroxy-1,1'-binaphthyl in 50 ml of acetic anhydride are initially introduced into a 250 ml three-necked flask provided with a reflux condenser, a KPG stirrer and an inert gas connection and are dissolved. A solution of 4.35 ml (42.80 mmol) of nitric acid (62%) in 25 ml of acetic anhydride is then added dropwise to the solution at 0° C. in the course of 30 min. At the same temperature, stirring is carried out for 4 h and the precipitated orange-red solid is filtered off with suction on a frit. After the end of the reaction, the mixture is carefully poured in 500 ml of ice water and thoroughly stirred. The solid nitro product is filtered off with suction and thoroughly washed with water.

The crude product is dissolved in toluene at room temperature (2 ml/g) and heated to 90° C. and petroleum ether (4 ml/g) is added until crystallization begins. Thereafter, the suspension is slowly cooled to room temperature, and the suspension is stored for a further 4 h in a freezer at −18° C. and then filtered. The product obtained is dried for 24 h at 200 mbar and 55° C.

Yield 5.72 g (87% of theory).

Stage 2: 2,2'-Diacetoxy-3,3'-diamino-1,1'-binaphthyl hydrochloride

The hydrogenation is effected according to known processes for the hydrogenation of nitro compounds, as described, for example, in European Patent No. EP 905 121, example 8.

31.09 g (67.57 mmol) of 2,2'-diacetoxy-3,3'-dinitro-1,1'-binaphthyl are dissolved in 600 ml of tetrahydrofuran, and 5.00 g of 5% Pd/C are added under inert gas. The suspension is introduced under Ar inert gas into a previously heated hydrogenation reactor and hydrogenated at room temperature for 24 h and under 2 bar $H_2$ pressure.

The suspension is then transferred under inert gas into 200 ml of ethanol. 10 ml of concentrated HCl are added with stirring and, when the product has completely dissolved, filtration is effected three times over a Büchner funnel to remove the Pd catalyst. The solution thus obtained is evaporated down to about 20 ml of ethanol at 70° C. and 300 mbar and then added to a solution of 700 ml of diethyl ether and 30 ml of acetone with rapid stirring. The suspension is stored for 24 h at −18° C. and the solid is filtered off and dried.

Yield: 28.65 g (90% of theory).

Preparation of the Polymers

Chemicals Used

Bisaminophenols:

2,2'-Di(4-amino-3-hydroxyphenyloxy)-1,1'-binaphthyl—(bisaminophenol 1)

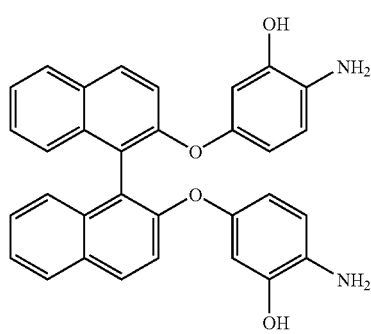

3,3'-Diamino-2,2'-dihydroxy-1,1'-binaphthyl—(bis-amino—phenol 2)

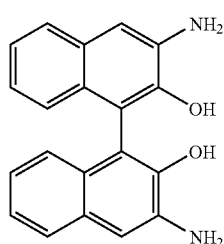

9,9'-Bis(3-amino-4-hydroxyphenyl)fluorene—(bisaminophenol 3)

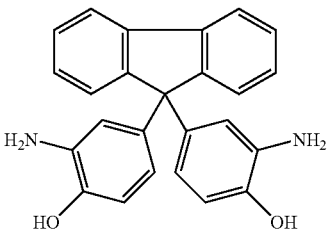

4,4'-Diamino-3,3'-dihydroxybiphenyl—(bisaminophenol 4)

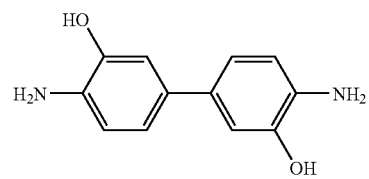

2,2'-Diacetoxy-3,3'-diamino-1,1'-binaphthyl—(bis-aminophenol 5)

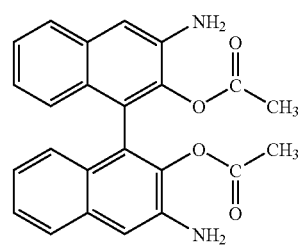

Dicarboxylic Acid Chlorides

Naphthalene-2,6-dicarboxylic acid chloride—(dicarboxylic acid chloride 1)

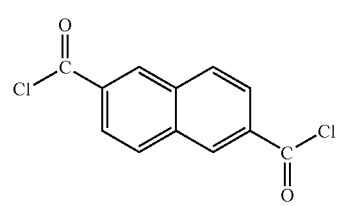

Biphenyl-4,4'-dicarboxylic acid chloride (dicarboxylic acid chloride 2)

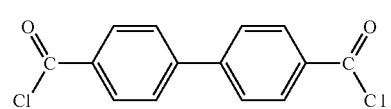

phenyl-4,4'-dicarboxylic acid chloride—(dicarboxylic acid chloride 3)

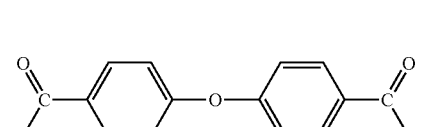

Terephthaloyl chloride (dicarboxylic acid chloride 4)

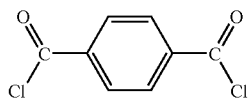

5-Phenylethynylisophthoyl chloride—(dicarboxylic acid chloride 5)

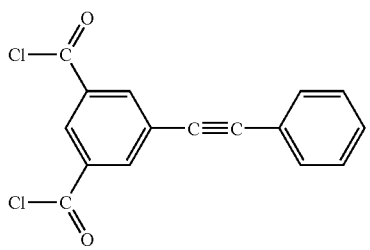

5-Allyloxyisophthaloyl dichloride—(dicarboxylic acid chloride 6)

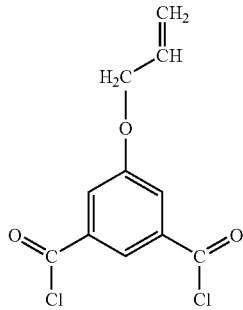

Endcaps ($E^1$, $E^2$):

Methacryloyl Chloride—(Endcap 1)

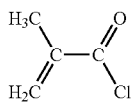

5-Norbornene-2-carboxylic acid chloride—(endcap 2)

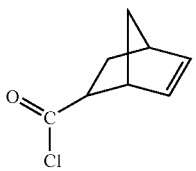

5-Norbornene-2,3-dicarboxylic acid anhydride (endcap 3)

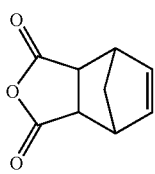

EXAMPLE 4

Synthesis of Polymer 1

50 g (0.1 mmol) of bisaminophenol 1 are dissolved in 400 ml of distilled N-methylpyrrolidone (NMP). A solution of 23.93 g (0.095 mol) of dicarboxylic acid chloride 1, dissolved in 200 ml of distilled NMP is added dropwise to this solution at 10° C. while stirring. Stirring is continued for a further hour at 10° C. and then for one hour at 20° C. After further cooling to 10° C., 1.64 g (0.01 mol) of endcap 3, dissolved in 50 ml of distilled γ-butyrolactone (γ-BL) are added dropwise to the reaction mixture, and stirring is carried out for one hour at 10° C. and then for one hour at 20° C. The reaction solution is cooled to 10° C., after which 19.76 g (0.25 mol) of pyridine, dissolved in 30 ml of distilled γ-BL, are added to said reaction solution and the latter is warmed up to room temperature and stirred for 2 hours.

In order to isolate the polymer, the reaction mixture is filtered and the filtrate is added dropwise to a mixture of 1 l of demineralized water and 200 ml of isopropanol while stirring, a further 3 l of demineralized water being added during the dropwise addition. The precipitated polymer is filtered off with suction and washed with 2 l of cold demineralized water. After the filtration with suction, the polymer is stirred twice for 1 hour at room temperature in 2.5 l portions of a 3% strength ammonia solution and then filtered off with suction. The polymer is washed neutral with demineralized water, filtered off, and dried for 72 hours at 50° C./10 mbar.

The polymer prepared in this manner is readily soluble in solvents such as NMP, γ-BL, cyclohexanone, cyclopentanone or mixtures thereof.

EXAMPLE 5

Synthesis of Polymer 2

15.81 g (0.05 mol) of bisaminophenol 2 are dissolved in 200 ml of distilled NMP. A solution of 8.82 g (0.03 mol) of dicarboxylic acid chloride 3 and 3.53 g (0.0175 mol) of dicarboxylic acid chloride 4 in 150 ml of distilled γ-BL is added dropwise to this solution at 10° C. while stirring.

Stirring is continued for a further hour at 10° C. and then for 1 hour at 20° C. After further cooling to 10° C., 0.52 g (0.005 mol) of endcap 1, dissolved in 20 ml of distilled γ-BL, is added dropwise to the reaction mixture, and stirring is carried out for 1 hour at 10° C. and then for 1 hour at 20° C. The reaction mixture is cooled to 10° C., after which 9.48 g (0.12 mol) of pyridine, dissolved in 30 ml of distilled γ-BL, are added to said reaction mixture and the latter is warmed up to room temperature and stirred for 2 hour.

Polymer 2 is isolated and worked-up analogously to example 4.

EXAMPLE 6

Synthesis of Polymer 3

25 g (0.05 mol) of bisaminophenol 1 are dissolved in 200 ml of distilled NMP. A solution of 5.56 g (0.02 mol) of dicarboxylic acid chloride 2 in 80 ml of distilled γ-BL is added dropwise to this solution at 10° C. while stirring. Stirring is carried out for a further hour at 10° C. and then for 1 hour at 20° C. Cooling is effected at 10° C. and 5.55 g (0.0275 mol) of dicarboxylic acid chloride 4, dissolved in 80 ml of distilled γ-BL, are added dropwise. Stirring is carried out for a further hour at 10° C. and then for 1 hour at 20° C. After cooling to 10° C., 0.78 g (0.005 mol) of endcap 2 dissolved in 20 ml of distilled γ-BL is added dropwise to the reaction mixture, and stirring is carried out for 1 hour at 10° C. and then for 1 hour at 20° C. The reaction mixture is cooled to 10° C., after which 11.85 g (0.15 mol) of pyridine, dissolved in 50 ml of distilled γ-BL, are added and said reaction mixture is warmed up to room temperature and stirred for 2 hours.

Polymer 3 is isolated and worked-up analogously to example 4.

EXAMPLE 7

Synthesis of Polymer 4

25 g (0.05 mol) of bisaminophenol 1 and 20 g (0.05 mol) of bisaminophenol 5 are dissolved in 400 ml of distilled NMP. A solution of 27.93 g (0.095 mol) of dicarboxylic acid chloride 3 in 150 ml of distilled γ-BL is added dropwise to this solution at 10° C. while stirring. Stirring is continued for a further hour at 10° C. and then for 1 hour at 20° C. After further cooling to 10° C., 1.64 g (0.01 mol) of endcap 3, dissolved in 20 ml of distilled γ-BL, are added dropwise to the reaction mixture and stirring is carried out for 1 hour at 10° C. and then for 1 hour at 20° C. The reaction mixture is cooled to 10° C., after which 19.76 g (0.25 mol) of pyridine, dissolved in 50 ml of distilled γ-BL, are added and said reaction mixture is warmed up to room temperature and stirred for 2 hours.

Polymer 4 is isolated and worked-up analogously to example 4.

EXAMPLE 8

Synthesis of Polymer 5

18.97 g (0.06 mol) of bisaminophenol 2 and 15.2 g (0.04 mol) of bisaminophenol 3 are dissolved in 300 ml of distilled NMP. A solution of 14.7 g (0.05 mol) of dicarboxylic acid chloride 3 and 13.59 g (0.045 mol) of dicarboxylic acid chloride 5, dissolved in 250 ml of distilled γ-BL, are added dropwise to this solution at 10° C. while stirring. Stirring is continued for 1 hour at 10° C. and for 1 hour at 20° C. After further cooling to 10° C., 1.56 g (0.01 mol) of endcap 2, dissolved in 50 ml of distilled γ-BL, are added dropwise to the reaction mixture, and stirring is carried out for 1 hour at 10° C. and then for 1 hour at 20° C. The reaction mixture is cooled to 10° C., after which 19.76 g (0.25 mol) of pyridine, dissolved in 50 ml of distilled γ-BL, are added and said reaction mixture is warmed up to room temperature and stirred for 2 hours.

The isolation and working-up of polymer 5 are effected analogously to example 4.

EXAMPLE 9

Synthesis of Polymer 6

30.01 g (0.06 mol) of bisaminophenol 1 are dissolved in 220 ml of distilled NMP. A solution of 11.11 g (0.055 mol) of dicarboxylic acid chloride 1 in 80 ml of distilled γ-BL are added dropwise to this solution at 10° C. while stirring. Stirring is continued for 1 hour at 10° C. and for 1 hour at 20° C. Cooling is effected to 10° C. and 15.2 g (0.04 mol) of bisaminophenol 3, dissolved in 80 ml of distilled γ-BL, are added dropwise. Stirring is continued for 1 hour at 10° C. and then for 1 hour at 20° C. Further cooling is effected to 10° C. and 12.08 g (0.04 mol) of dicarboxylic acid chloride 5, dissolved in 80 ml of distilled γ-BL, are added dropwise. Stirring is carried out for a further hour at 10° C. and then for 1 hour at 20° C. After further cooling to 10° C., 1.04 g (0.01 mol) of endcap 1, dissolved in 20 ml of distilled γ-BL, are added dropwise to the reaction mixture, and stirring is carried out for 1 hour at 10° C. and then for 1 hour at 20° C. The reaction mixture is cooled to 10° C., after which 19.76 g (0.25 mol) of pyridine, dissolved in 50 ml of distilled γ-BL, were added and said reaction mixture is warmed up to room temperature and stirred for 2 hours.

Polymer 6 is isolated and worked-up analogously to example 4.

EXAMPLE 10

Determination of Thermal Stabilities

All polymers described have thermal stabilities of >480° C. according to TGA investigations (apparatus: STA 1500 from Rheometric Scientific, heating rate: 5 K/min, inert gas: argon). The isothermal mass loss per hour (at 425° C.) is <0.7%. The polymers described therefore meet the requirements for use as insulation in microchips.

EXAMPLE 11

Preparation of Polymer Solutions 25 g of the polymers described in examples 4 to 9 are dissolved in 75 g of distilled NMP or distilled γ-BL. The dissolution process is expediently effected on a shaking apparatus at room temperature. The solution is then filtered under pressure through a 0.2 μm filter into a cleaned, particle-free glass sample tube. The viscosity of the polymer solution can be changed by varying the dissolved mass of polymer.

EXAMPLE 12

Improvement of the Adhesion by Adhesion Promoter Solutions 0.5 g of adhesion promoter (e.g. N-(2-aminoethyl)-3-aminopropylmethyldimethoxysilane) are dissolved in 95 g of methanol, ethanol or isopropanol and 5 g of demineralized water at room temperature in a cleaned, particle-free sample tube. After standing for 24 h at room temperature, the adhesion promoter solution is ready for use. This solution is usable for 3 weeks at the most.

The adhesion promoter should give a monomolecular layer on the surface of the parts to be adhesively bonded. The adhesion promoter can expediently be applied by the spin coating technique. For this purpose, the adhesion promoter solution is applied via a 0.2 µm prefilter to the surface to be adhesively bonded and is spun for 30 s at 5000 rpm. A drying step is then effected for 60 s at 100° C.

EXAMPLE 13

Application of a Polymer by the Spin Coating Method and Cyclization to Give the Polybenzoxazole A processed silicon wafer that has lands and trenches up to a minimum dimension of, in each case, about 150 nm is coated, as described in example 10, with an adhesion promoter. The filtered solution of polymer 1, which was obtained according to example 11, is then applied to the wafer by using a syringe and is uniformly distributed using a spin coater. The spin coater speed is 2,000 rpm. The polymer is then heated on a hotplate for 1 min at 120° C. and for 2 min at 200° C. The coated wafer is then heated under nitrogen or argon in an oven to 425° C. for 60 min. The polybenzoxazole thus obtained is inert to acids, bases and organic solvents.

EXAMPLE 14

Determination of the Adhesion of the Polymers to a Titanium Nitride Layer

A 4" silicon wafer is sputtered with a 50 nm thick titanium nitride layer. The solution prepared in example 11 is applied to this wafer by spin coating, at 500 rpm for 5 s and at 2,000 rpm for 25 s. After a short softbake of 1 min at 120° C. on a hotplate, 10 silicon chips having an edge length of 4×4 mm$^2$, which had likewise been sputtered with a 50 nm thick titanium nitride layer, are then pressed onto the polymer film with a force of 2 N. This stack is then heated in a nitrogen atmosphere for 1 h at 425° C. in an oven. Following cooling to room temperature, an adhesion test was carried out using a shear tester, Dage series 400. The mean value for polymer 1 that was required for shearing off the chips is 15.51 N/mm$^2$.

EXAMPLE 15

Determination of the Adhesion of the Polymers to a Tantalum Nitride Layer

The experiment carried out was the same as that described in Example 14, but the surface of the wafer and of the chips was formed not of titanium nitride but of tantalum nitride. The mean value of the force for polymer 1 that was required for shearing off the chips is 16.01 N/mm$^2$.

EXAMPLE 16

Determination of the Adhesion of the Polymer to a Silicon Surface

The experiment carried out is the same as that described in Example 14, but the surface of the wafer and of the chips is formed not of titanium nitride but of silicon. The mean value of the force for polymer 1 that was required for shearing off the chips is 17.05 N/mm$^2$.

EXAMPLE 17

Determination of the Adhesion of the Polymers to a Silicon Nitride Layer

The experiment carried out is the same as that described in Example 14, but the surface of the wafer and of the chips is not formed of titanium nitride but of silicon nitride. The mean value of the force for polymer 1 that was required for shearing off the chips is 15.16 N/mm$^2$.

EXAMPLE 18

Determination of the Adhesion of the Polymers to a Silica Layer

The experiment carried out is the same as that described in example 14, but the surface of the wafer and of the chips is formed not of titanium nitride but of silica. The mean value of the force for polymer 1 that was required for shearing off the chips is 16.20 N/mm$^2$.

EXAMPLE 19

Determination of the Adhesion of the Polymers to a Silicon Carbide Layer

The experiment carried out is the same as that described in Example 14, but the surface of the wafer and of the chips was not formed of titanium nitride but of silicon carbide. The mean value of the force for polymer 1 that was required for shearing off the chips is 15.73 N/mm$^2$.

EXAMPLE 20

Determination of the Adhesion of the Polymers to a Tantalum Layer

The experiment carried out is the same as that described in Example 14, but the surface of the wafer and of the chips was not formed of titanium nitride but of tantalum. The mean value of the force for polymer 1 that was required for shearing off the chips is 16.68 N/mm$^2$.

EXAMPLE 21

Determination of the Adhesion of the Polymers to a Titanium Layer

The experiment carried out is the same as that described in example 14, but the surface of the wafer and of the chips were formed not of titanium nitride but of titanium. The mean value of the force for polymer 1 that was required for shearing off the chips is 15.84 N/mm$^2$.

EXAMPLE 22

Determination of the Adhesion of the Polymers to a Polyimide Layer

The experiment carried out is the same as that described in Example 14, but the surface of the wafer and of the chips was not formed of titanium nitride but of polyimide. The mean value of the force for polymer 1 that was required for shearing off the chips is 16.26 N/mm$^2$.

EXAMPLE 23

Comparative Example for Adhesion

A polymer was prepared analogously to Example 1 of U.S. Pat. No. 5,077,378 and a polymer solution in NMP was prepared as described in Example 11. The adhesion of the polymer was then determined as described in examples 14 to 22. The following mean values were found:

TABLE 1

Adhesion of the comparative polymers

| Surface | Force for shearing off (N/mm$^2$) |
| --- | --- |
| Titanium nitride | 14.71 |
| Tantalum nitride | 15.69 |
| Silicon | 15.21 |
| Silicon nitride | 14.03 |
| Silica | 14.94 |
| Silicon carbide | 13.37 |
| Tantalum | 13.96 |
| Titanium | 14.07 |
| Polyimide | 13.02 |

EXAMPLE 24

Determination of the Chemical Stability

The polymer 1 was applied from a 20% strength solution (solvent: NMP) to a 4" silicon wafer by spin coating, at 500 rpm for 5 s and at 2 000 rpm for 25 s. After a short softbake of 1 min at 120° C. and 2 min at 200° C. on a hotplate, the wafer is heated in a nitrogen atmosphere for 1 h at 400° C. in an oven. After cooling to room temperature, the coated wafer is heated in NMP to 80° C. for 5 h. Thereafter, the wafer is dried in vacuo for 60 min at 200° C. and the mass difference is determined.

The decrease in mass is 0.8%.

EXAMPLE 25

Determination of the Dielectric Constant of Polymer 1

Figure 2:
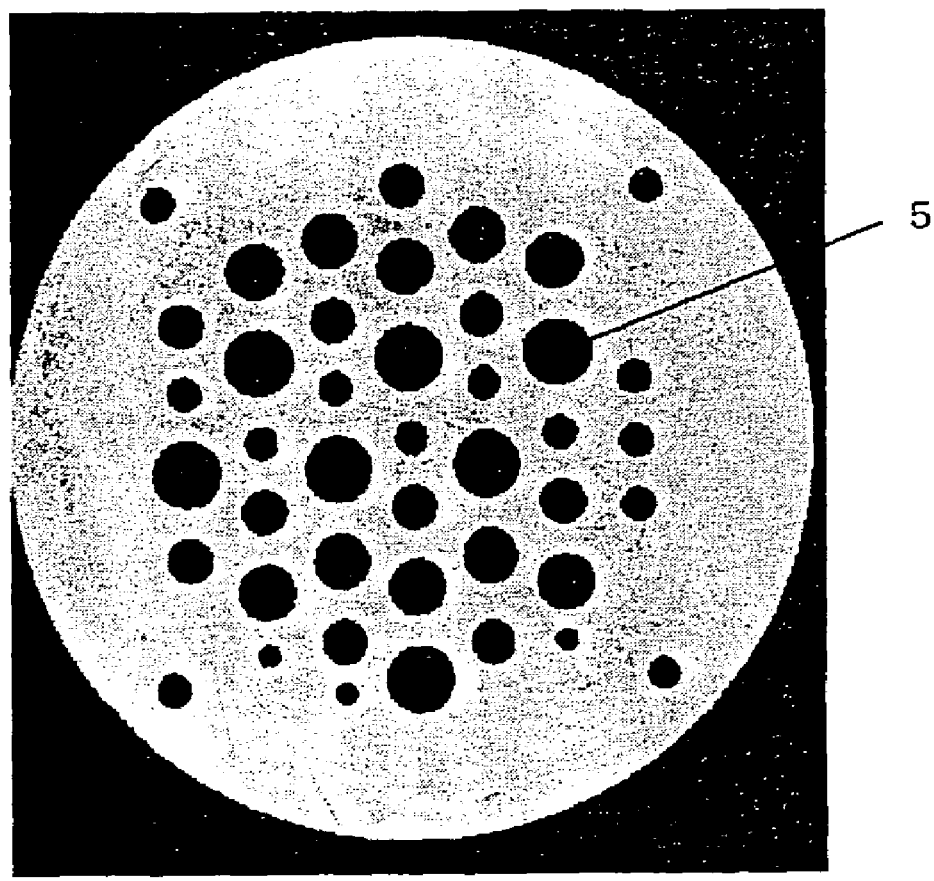
FIG. 2 is a photograph showing a shadow mask as used in example 25 for the production of electrodes.

The dielectric constant was measured using the configuration shown in FIG. 1. For this purpose, the polymer 1 was dissolved in NMP (25% strength solution) and the solution was filtered under pressure through a membrane having 0.2 μm pores. This solution was applied by spin coating to a substrate 1 on which a 600 nm thick titanium layer 2 is already present. The layer 3 is dried at 120° C. and 200° C., in each case for 2 min, on a hotplate and then heated at 430° C. for one hour in a nitrogen atmosphere. Titanium electrodes 4 are then sputtered onto this layer 3 by using a shadow mask shown in FIG. 2. For this purpose, the shadow mask shown in FIG. 2 includes orifices 5 which correspond to the position of the titanium electrodes 4. The dielectric constant is determined using the impedance spectrometer 6 and is 2.31 in the frequency range from 100 Hz to 1 MHz.

EXAMPLE 26 TO 29

Determination of the Dielectric Constants of Polymers 2 to 5

The dielectric constant was determined analogously to example 25 in polymers 2 to 5. The values found are shown in Table 2.

EXAMPLE 30

Comparative Example for Dielectric Constant

A polymer was prepared analogously to Example 1 of U.S. Pat. No. 5,077,378 and the dielectric constant is determined as described in example 25. The value found is likewise shown in Table 2.

TABLE 2

Dielectric constant of various polymers

| Example | Polymer | Dielectric constant |
| --- | --- | --- |
| 25 | 1 | 2.31 |
| 26 | 2 | 2.32 |
| 27 | 3 | 2.44 |
| 28 | 4 | 2.31 |
| 29 | 5 | 2.39 |
| 30 | US 5,077,378 Ex. 1 | 3.1 |

We claim:
1. A method of forming a dielectric, which comprises: providing a polybenzoxazole of Formula III

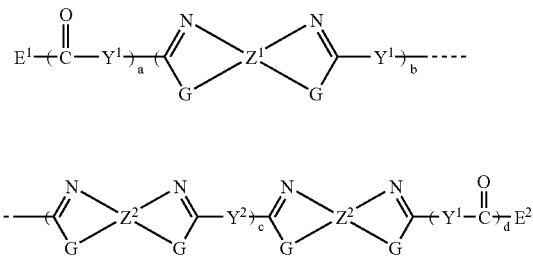
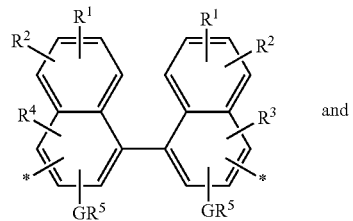

Formula III where
$Z^1$ has a formula selected from the group consisting of

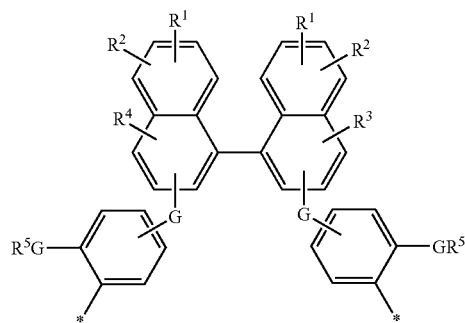

and wherein
E¹ and E² are substituents in each case independently selected from the group consisting of:
in the case when at least one of a and d=0

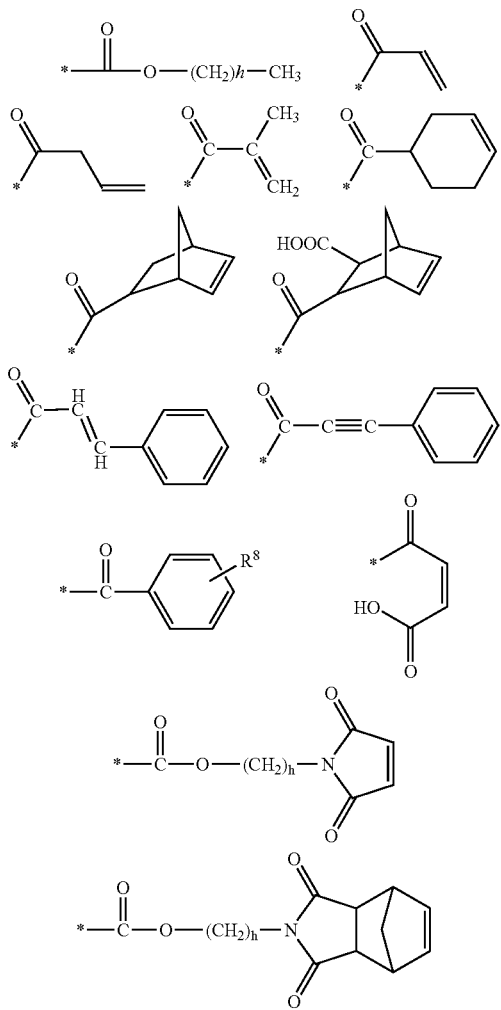

in the case when at least one of a and d=1,

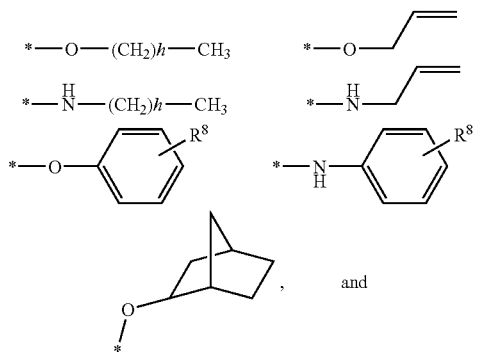

otherwise, E1 and E2 are substituents in each case independently selected from the group consisting of a saturated monovalent hydrocarbon, and an unsaturated monovalent hydrocarbon, wherein $R^8$ is selected from the group consisting of:

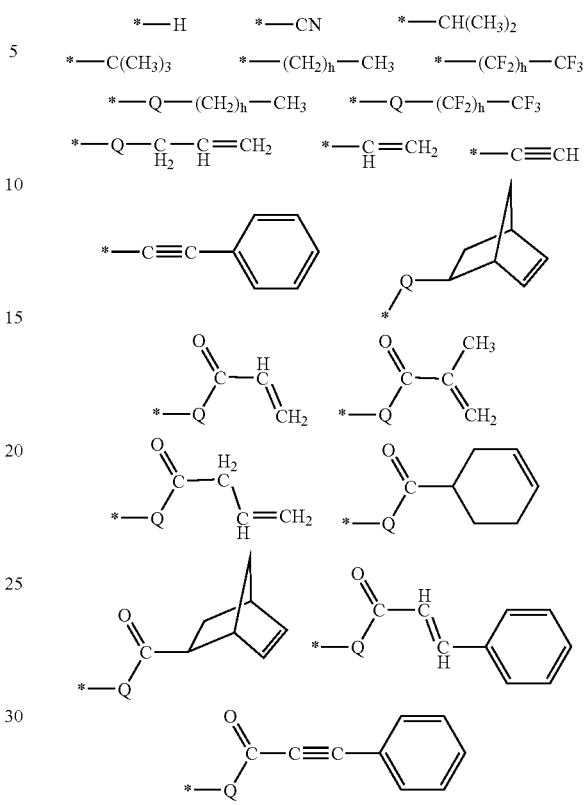

wherein:
h=0–10, and
Q=*—O—*, *—S—*, *—NH—*,
$Y^1$ and $Y^2$, in each case independently for each position, are a divalent hydrocarbon;
$Z^2$, in each case independently for each position, is a tetravalent hydrocarbon composed of groups linked to one another and selected from the group consisting of alkyl and aryl groups;
$R^1$, $R^2$, $R^3$, and $R^4$, in each case independently, are substitutents selected from the group consisting of H, —$C_6H_5$, —$(CH_2)_n$—CH3, -G-$(CH_2)_n$—$CH_3$, CH$((CH_2)_nCH_3)_2$, —$CH(CH_3)_2$, -G-$CH(CH_3)_2$, —C$(CH_3)_3$,. -G-C$(CH_3)_3$, —$(CF_2)_n$—$CF_3$, -G-$(CF_2)_n$—$CF_3$, —CF$((CF_2)_nCF_3)_2$, —CF$(CF_3)_2$, —C$(CF_3)_3$, —N$(CH_3)_2$, —N$(CF_3)_2$,

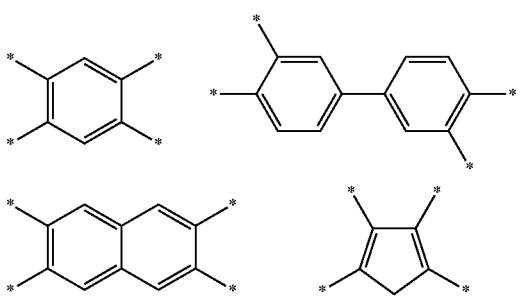

-continued

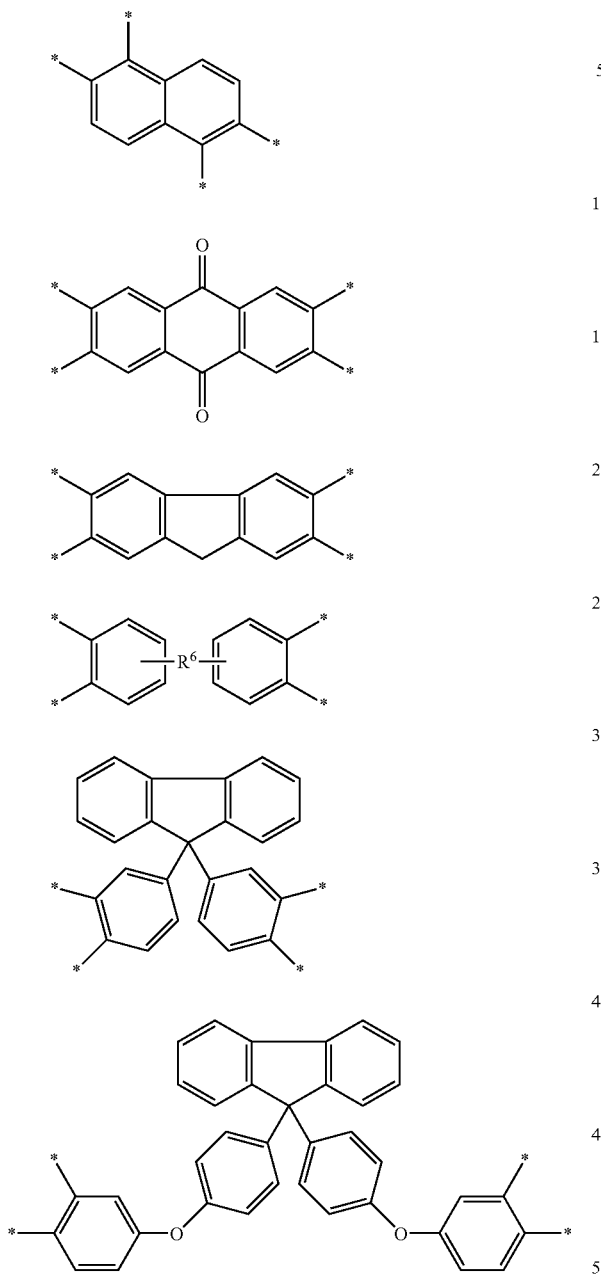

R[5], in each case independently, is a substituent selected from the group consisting of H, —CO(CH$_2$)$_n$—CH3, —COO—(CH$_2$)$_n$—CH$_3$, —(CH$_2$)$_n$—CH3, —CH(CH$_2$)$_n$CH$_3$)$_2$, —CH(CH$_3$)$_2$, —C(CH$_3$)$_3$, —(CF$_2$)$_n$—CF$_3$, —CF((CF$_2$)$_n$CF$_3$)$_2$, —CF(CF$_3$)$_2$, —C(CF$_3$)$_3$, —(CH$_2$)$_n$—C$_6$H$_5$, z—COO—(CH$_2$)$_n$—C$_6$H$_5$;

G is a heteroatom selected from the group consisting of oxygen and sulfur;
a is an integer from 0 to 1;
b has a value from 1 to 200;
c has a value from 0 to 200; and
d is an integer from 0 to 1; and
n is an integer from 0 to 10.

2. An electronic component, comprising a dielectric containing a polybenzoxazole having a formula III

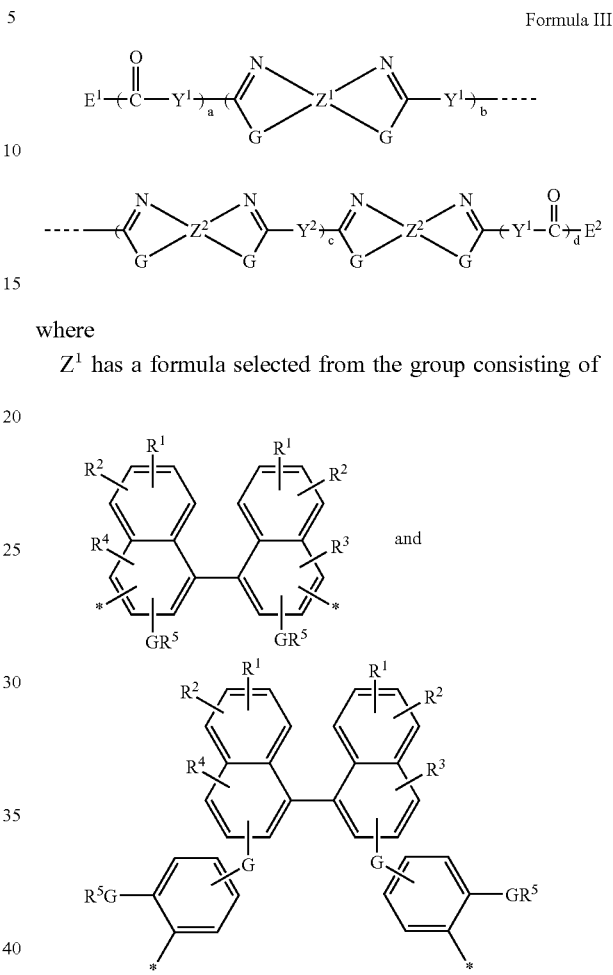

where
Z[1] has a formula selected from the group consisting of $E^1$ und $E^2$ are substituents in each case independently selected from the group consisting of:
in the case when at least one of a and d=0

-continued

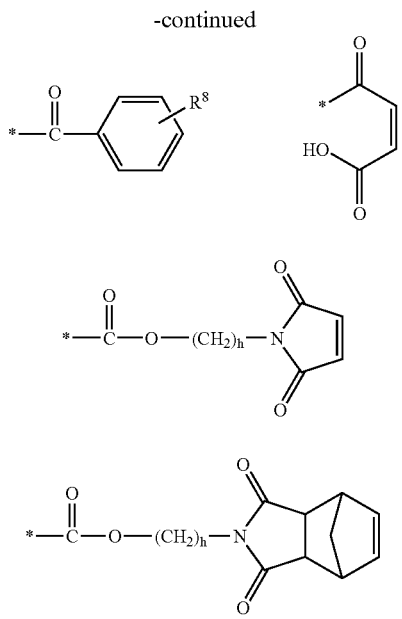

in the case when at lest one of a and d=1,

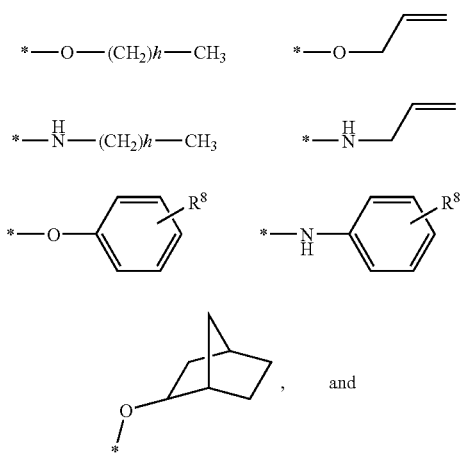

otherwise E1 and E2 are substituents in each case independently selected from the group consisting of a saturated monovalent hydrocarbon, and an unsaturated monovalent hydrocarbon;

wherein $R^8$ is selected from the group consisting of:

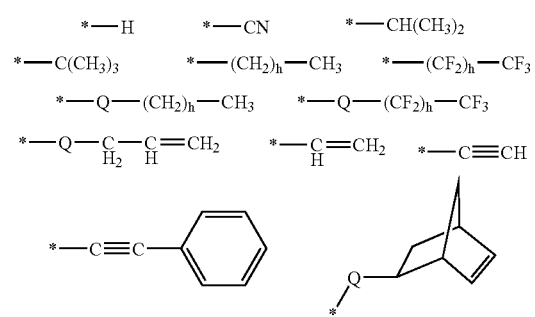

-continued

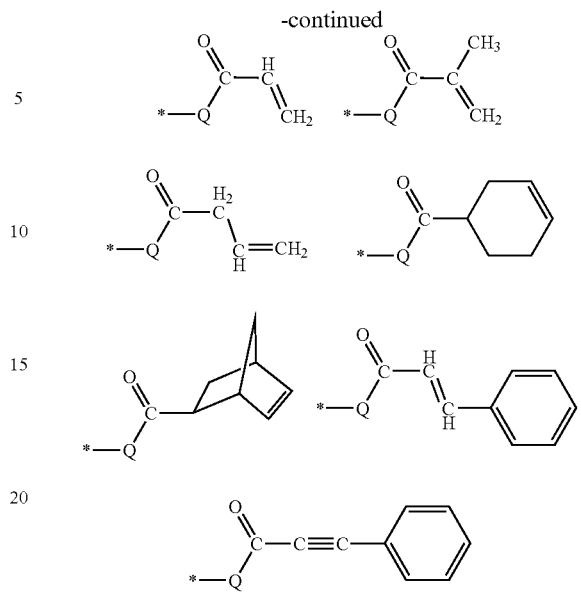

wherein:
h=0–10, and
Q=*—O—*, *—S—*, *—NH—,*
$Y^1$ and $Y^2$, in each case independently for each position, are a divalent hydrocarbon;
$Z^2$, in each case independently for each position, is a tetravalent hydrocarbon composed of groups linked to one another and selected from the group consisting of alkyl and aryl groups;
$R^1$, $R^2$, $R^3$, and $R^4$, in each case independently, are substitutents selected from the group consisting of H, —$C_6H_5$, —$(CH_2)_n$—CH3, -G-$(CH_2)_n$—CH3, —CH$((CH_2)_nCH_3)_2$, —$CH(CH_3)_2$, -G-$CH(CH_3)_2$, —C$(CH_3)_3$, -G-$C(CH_3)_3$, —$(CF_2)_n$—$CF_3$, -G-$(CF_2)_n$—$CF_3$, —$CF((CF_2)_nCF_3)_2$, —$CF(CF_3)_2$, —$C(CF_3)_3$, —$N(CH_3)_2$, —$N(CF_3)_2$,

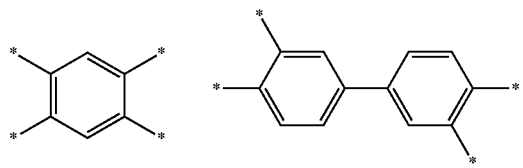

-continued

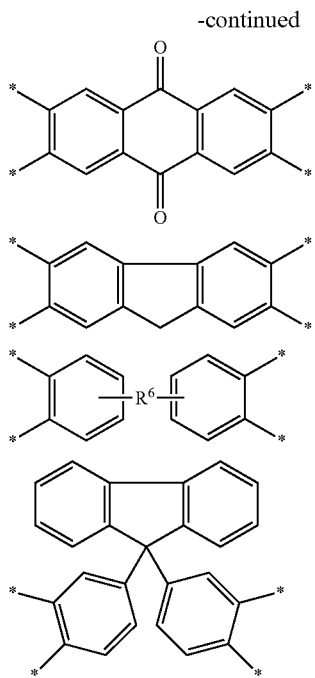

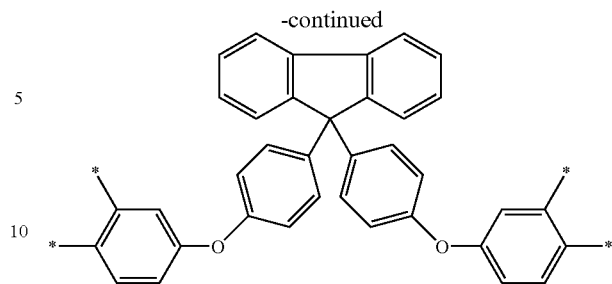

$R^5$, in each case independently, is a substituent selected from the group consisting of H, —CO(CH$_2$)$_n$—CH3, —COO—(CH$_2$)$_n$—CH$_3$, —(CH$_2$)$_n$—CH3, —CH(CH$_2$)$_n$CH$_3$)$_2$, —CH(CH$_3$)$_2$, —C(CH$_3$)$_3$, —(CF$_2$)$_n$—CF$_3$, —CF((CF$_2$)$_n$CF$_3$)$_2$, —CF(CF$_3$)$_2$, —C(CF$_3$)$_3$, —(CH$_2$)$_n$—C$_6$H$_5$, z-COO—(CH$_2$)$_n$—C$_6$H$_5$;

G is a heteroatom selected from the group consisting of oxygen and sulfur;

a is an integer from 0 to 1;

b has a value from 1 to 200;

c has a value from 0 to 200; and d is an integer from 0 to 1; and n is an integer from 0 to 10.

* * * * *